(12) United States Patent
Park et al.

(10) Patent No.: US 7,851,802 B2
(45) Date of Patent: Dec. 14, 2010

(54) POLY-CRYSTALLINE THIN FILM, THIN FILM TRANSISTOR FORMED FROM A POLY-CRYSTALLINE THIN FILM AND METHODS OF MANUFACTURING THE SAME

(75) Inventors: Kyung-bae Park, Seoul (KR); Seon-mi Yoon, Yongin-si (KR); Sang-yoon Lee, Seoul (KR); Jae-young Choi, Suwon-si (KR); Hyeon-jin Shin, Suwon-si (KR); Myung-kwan Ryu, Yongin-si (KR); Tae-sang Kim, Seoul (KR); Jang-yeon Kwon, Seongnam-si (KR); Kyung-seok Son, Seoul (KR); Ji-sim Jung, Incheon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 321 days.

(21) Appl. No.: 12/219,265

(22) Filed: Jul. 18, 2008

(65) Prior Publication Data
US 2009/0127560 A1    May 21, 2009

(30) Foreign Application Priority Data
Nov. 20, 2007   (KR)   ............... 10-2007-0118827

(51) Int. Cl.
*H01L 31/036* (2006.01)
(52) U.S. Cl. .................... 257/66; 257/70; 257/75; 257/E21.049; 257/E21.414; 438/166; 977/762; 977/778
(58) Field of Classification Search .................. None
See application file for complete search history.

(56) References Cited
U.S. PATENT DOCUMENTS
2010/0127172 A1*   5/2010   Nikoobakht ............. 250/332

* cited by examiner

*Primary Examiner*—Evan Pert
*Assistant Examiner*—Scott R Wilson
(74) *Attorney, Agent, or Firm*—Harness, Dickey & Pierce, P.L.C.

(57) ABSTRACT

Example embodiments relate to a poly-crystalline silicon (Si) thin film, a thin film transistor (TFT) formed from a poly-crystalline silicon (Si) thin film and methods of manufacturing the same. The method of manufacturing the poly-crystalline Si thin film includes forming an active layer formed of amorphous Si on a substrate, coating a gold nanorod on the active layer, and irradiating infrared rays onto the gold nanorod to crystallize the active layer.

20 Claims, 6 Drawing Sheets

POLY-CRYSTALLINE THIN FILM, THIN FILM TRANSISTOR FORMED FROM A POLY-CRYSTALLINE THIN FILM AND METHODS OF MANUFACTURING THE SAME

PRIORITY STATEMENT

This application claims the benefit of priority under 35 U.S.C. §119 to Korean Patent Application No. 10-2007-0118827, filed on Nov. 20, 2007, in the Korean Intellectual Property Office, the disclosure of which is incorporated herein in its entirety by reference.

BACKGROUND

1. Field

Example embodiments relate to a poly-crystalline silicon (Si) thin film, a thin film transistor (TFT) formed from a poly-crystalline silicon (Si) thin film and methods of manufacturing the same. Other example embodiments relate to a method of manufacturing a poly-crystalline Si thin film, having a substantially large area, that may be crystallized at a substantially low temperature and a method of manufacturing a TFT using the same.

2. Description of the Related Art

Recently, research has been conducted on a low temperature poly-silicon thin film transistor (LTPS TFT) that may be used in an organic light emitting display device, a liquid crystal display device or the like. Research continues to be conducted in regard to a system-on-glass (SOG) having no external driver integrated circuit (IC). By integrating the external driver IC into a display panel, it may not be necessary to use a connector between the display panel and the external driver IC. As such, physical pixel error may be reduced, increasing reliability of the display device. An SOG, in which a display system including a controller, and data and gate driver ICs is integrated into the display panel, may be desirable. In order to integrate the display system, a mobility of the LTPS greater than 400 cm$^2$/Vsec and/or increased uniformity of the LTPS, is desirable.

LTPS having a desired qualities (and/or characteristics) may be difficult to manufacture using excimer laser annealing (ELA), sequential lateral solidification (SLS), metal-induced lateral crystallization (MILC) or the like.

A method of manufacturing poly-crystalline Si may be characterized as a method in which poly-crystalline Si is directly deposited, or a method in which amorphous Si is deposited to be crystallized. In the latter method, by forming an amorphous Si on a substrate and performing excimer laser annealing (ELA) (e.g., a heat-treatment with respect to the amorphous Si by using an excimer laser), the amorphous Si may be crystallized and converted into poly-crystalline Si.

The excimer laser used in the ELA emits a square beam that is about 1 cm wide. Heat-treatment with the square beam, which is performed with respect to the amorphous Si thin film having a substantially large area, may be performed sequentially on each divided portion included in a region having check patterns, which each correspond to the size of the square beam.

According to the heat-treatment performed with respect to each sequential divided portion, crystallization may not occur on a boundary between units of a region on which a unit of heat-treatment is performed. There may be a boundary having a crystallization state different from those of the other boundaries, even though crystallization may occur on the boundary. Due to the boundary between units of the region, parts of the poly-crystalline Si may have poor qualities (and/or characteristics). Thus, in an active matrix liquid crystal display device (AMLCD), or in an active matrix organic light emission diode display device (AMOLED), transistors for respective pixels may not uniformly operate. As such, an image may not be uniformly displayed.

SUMMARY

Example embodiments relate to a poly-crystalline silicon (Si) thin film, a thin film transistor (TFT) formed from a poly-crystalline silicon (Si) thin film and methods of manufacturing the same.

Other example embodiments relate to a method of manufacturing a poly-crystalline Si thin film, having a substantially large area, that may be crystallized at a substantially low temperature and a method of manufacturing a TFT using the same.

Example embodiments provide a method of manufacturing a poly-crystalline silicon (Si) thin film that may be crystallized having a substantially large area at a substantially low temperature by using infrared rays that are absorbed by a gold nanorod and a method of manufacturing a thin film transistor (TFT) using the method.

According to example embodiments, there is provided a method of manufacturing a poly-crystalline silicon (Si) thin film, the method including forming an active layer formed of amorphous Si on a substrate, coating a gold nanorod on the active layer, and irradiating infrared rays onto the gold nanorod to crystallize the active layer. A ratio of the length of the gold nanorod with respect to the diameter of the gold nanorod may be in a range of about 0.5 to about 2.

The method may include forming a heat transfer layer between the active layer and the gold nanorod. The heat transfer layer may be formed of one selected from Mo, Cr, Au, Ag AlN and combinations thereof.

The wavelength of the infrared rays may be in a range of about 750 nm to about 910 nm.

According to example embodiments, there is provided a method of manufacturing a thin film transistor (TFT), the method including forming an active layer formed of amorphous Si on a substrate, coating a gold nanorod on the active layer, irradiating infrared rays onto the gold nanorod to crystallize the active layer, doping the active layer with impurity ions, and patterning the active layer to form a channel region. The method may include forming a source electrode and a drain electrode, which are each positioned on side portions of the channel region.

BRIEF DESCRIPTION OF THE DRAWINGS

Example embodiments will be more clearly understood from the following detailed description taken in conjunction with the accompanying drawings. FIGS. 1A-4 represent non-limiting, example embodiments as described herein.

FIGS. 1A through 1C are cross-sectional views illustrating a method of manufacturing a poly-crystalline Silicon (Si) thin film according to example embodiments;

FIG. 2 is a cross-sectional view of a thin film transistor (TFT) manufactured using the method illustrated in FIGS. 1A to 1C;

FIG. 4 illustrates raman spectra for checking the degree of crystallinity of silicon according to example embodiments.

DETAILED DESCRIPTION OF EXAMPLE EMBODIMENTS

Figure 1A:
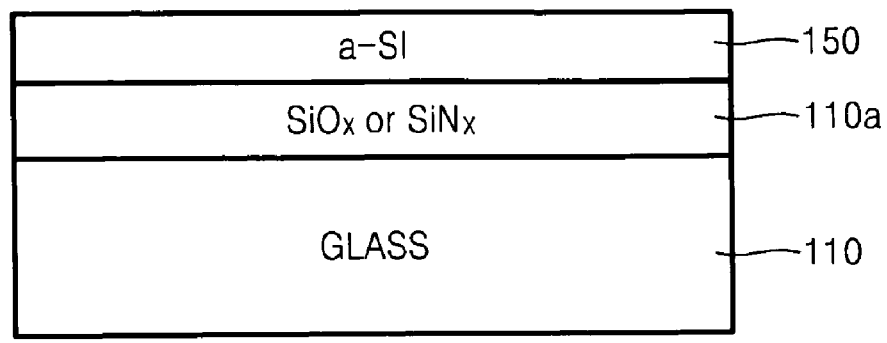

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

The endpoints of all ranges directed to the same component or property are inclusive of the endpoint and independently combinable. For example, ranges of "up to about 25 wt. %, or, more specifically, about 5 wt. % to about 20 wt. %," are inclusive of the endpoints and all intermediate values of the ranges of "about 5 wt. % to about 25 wt. %." The modifier "about" used in connection with a quantity is inclusive of the stated value and has the meaning dictated by the context (e.g., includes the degree of error associated with measurement of the particular quantity).

Example embodiments relate to a poly-crystalline silicon (Si) thin film, a thin film transistor (TFT) formed from a poly-crystalline silicon (Si) thin film and methods of manufacturing the same. Other example embodiments relate to a method of manufacturing a poly-crystalline Si thin film, having a substantially large area, that may be crystallized at a substantially low temperature and a method of manufacturing a TFT using the same.

Figure 1B:
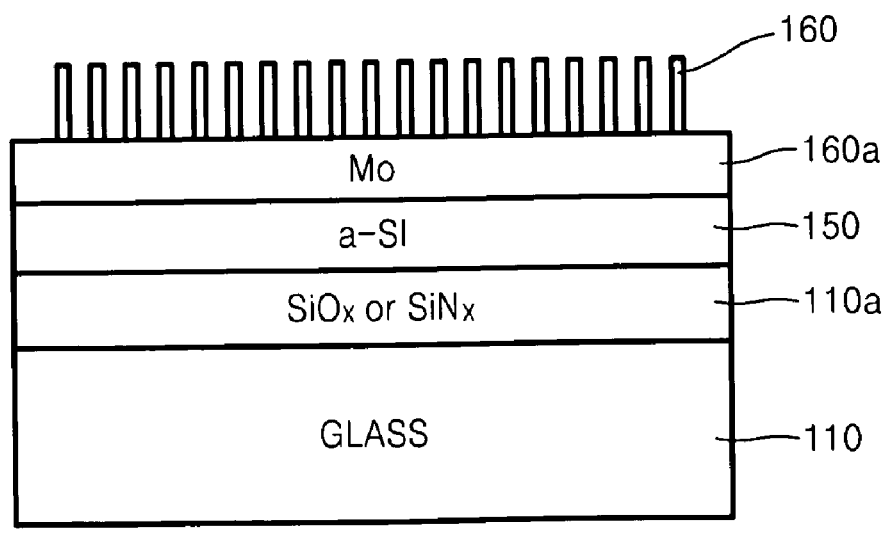
Figure 1C:
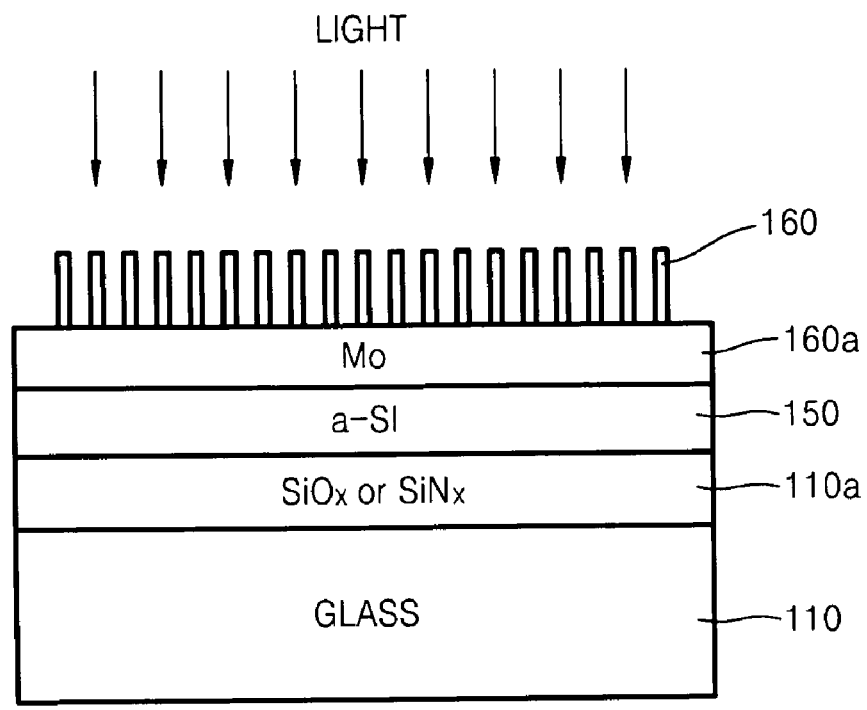

FIGS. 1A through 1C are cross-sectional views illustrating a method of manufacturing a poly-crystalline Silicon (Si) thin film according to example embodiments.

Referring to FIG. 1A, an active layer 150 formed of amorphous-silicon (Si) may be formed on a substrate 110. The active layer 150 may be formed using a gas mixture of $SiH_4$ and $H_2$ as a source gas in a plasma enhanced chemical vapor deposition (PECVD) process. The thickness of the active layer 150 may be in the range of about 500 Å to 2000 Å. The substrate 110 may be formed of a material commonly used for forming a substrate of a semiconductor device (e.g., silicon, glass, an organic material or the like).

A blocking layer 110a formed of an insulating material (e.g., a silicon oxide layer) may be formed between the substrate 110 and the active layer 150. The blocking layer 110a may be formed using $SiH_4$, $H_2$, $N_2O$ or the like as a source gas in a PECVD process. The blocking layer 110a prevents impurities of the substrate 110 from permeating into the active layer 150 in subsequent processes.

Referring to FIG. 1B, a plurality of gold nanorods 160 may be coated on the active layer 150. The gold nanorods 160 may be manufactured using a known method of manufacturing a gold nanorod (e.g., electrolysis, chemical reduction, optical reduction or the like).

In electrolysis, an aqueous solution including a cationic surfactant is electrolyzed in a constant current, and a gold cluster is leached from a gold plate of a positive electrode to form a gold nanorod. The cationic surfactant includes quaternary ammonium compounds in which a central nitrogen atom is joined to four hydrophobic substituents, or compounds in which an independent cluster of a molecule is not formed (e.g., tetra dodecyl ammonium bromide (TDAB)). The gold cluster leached from the gold plate of the positive electrode may be used as the source of gold opposed to gold salt (e.g., hydrogen tetra chloroaurate (III) ($HAuCl_4$), which is generally not used in the electrolysis). By applying supersonic waves in the electrolysis, a silver plate may be submerged in the aqueous solution to accelerate the growth of the gold nanorod.

In the chemical reduction, $HAuCl_4$ may be reduced by $NaBH_4$ to form a gold nanorod. The gold nanorod, functioning as a seed particle, may be grown in a solution to form the final gold nanorod. The length of the final gold nanorod may be determined according to the time necessary to grow the seed particle, and the ratio between the seed particle and the $HAuCl_4$ included in the solution used for growing the seed particle.

In the optical reduction, $HAuCl_4$ is placed in a similar solution as that used in the electrolysis. The $HAuCl_4$ may be reduced by applying supersonic waves to the solution. The supersonic waves are emitted from a low pressure mercury lamp. In the optical reduction, although a seed particle is not generated, a gold nanorod may be form. The length of the gold nanorod may be determined according to a time taken to apply the supersonic waves.

The gold nanorods 160 may be formed by coating a solution including a gold nanorod on the active layer 150, and drying the gold nanorod. If the gold nanorod is patterned such that it crystallizes, lateral crystallization of the gold nanorod is observed. A ratio of the length of the gold nanorod with respect to the diameter of the gold nanorod may be in a range of about 0.5 to about 2.

According to example embodiment, the method of manufacturing a poly-crystalline Si thin film may include forming a heat transfer layer 160a between the active layer 150 and the gold nanorods 160. The heat transfer layer 160a may be formed of a metal (e.g., molybdenum (Mo), chromium (Cr), gold (Au), silver (Ag) or combinations thereof), or an insulator (e.g., AlN or the like). The thickness of the heat transfer layer 160a may be in a range of approximately 100 Å to 5000 Å. The heat transfer layer 160a accelerates heat, generated by the gold nanorods 160 to be transferred, to the active layer 150. As such, the gold nanorods 160 may be more efficiently crystallized using light having a lower optical power. Heat may be more uniformly transferred to the substrate 110. As such, the gold nanorods 160 may be more uniformly crystallized on the substrate 110 having a substantially large area. Impurities included in the gold nanorods 160 may be prevented from permeating into the active layer 150.

Referring to FIG. 1C, infrared rays may be irradiated onto the gold nanorods 160, crystallizing the active layer 150. A laser or a lamp may be used as a light source for emitting the infrared rays. If a lamp is used, the substrate 110 having a substantially large area may be crystallized at one time. The wavelength of infrared rays may be in a range of about 750 nm to about 910 nm. The optical power of the infrared rays may be in a range of approximately 5 W to approximately 20 W. The gold nanorods 160 absorb the infrared rays to generate heat. Amorphous Si of the active layer 150 may be crystallized into poly-crystalline Si due to the generated heat. According to example embodiment, if the infrared rays are used in crystallization, the crystallization may be performed at a substantially low temperature of 100° C. or less, unlike in the case of solid phase crystallization (SPC) or metal induced crystallization (MIC).

Figure 2:
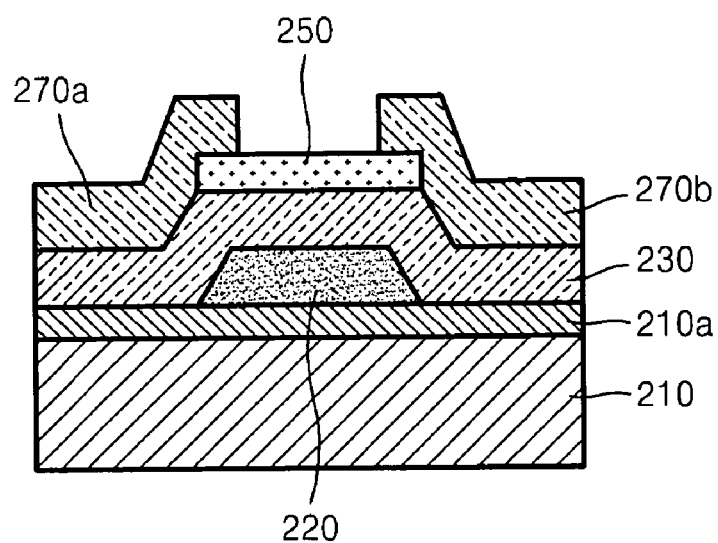

FIG. 2 is a cross-sectional view of a thin film transistor (TFT) manufactured using the method illustrated in FIGS. 1A to 1C.

Referring to FIG. 2, a gate 220 may be formed on a region of a substrate 210. A gate insulating layer 230 may be formed on the substrate 210 and the gate 220. The TFT may include a blocking layer 210a, formed of an oxide or a nitride, on the substrate 210. A channel 250 constituting (or functioning as) an active area may be formed on a portion of the gate insulating layer 230, which corresponds to the gate 220. A source electrode 270a and a drain electrode 270b may be each formed on opposing side portions of the channel 250.

Hereinafter, a method of manufacturing a TFT transistor according to example embodiments will be described with reference to FIGS. 3A through 3E.

Figure 3A:
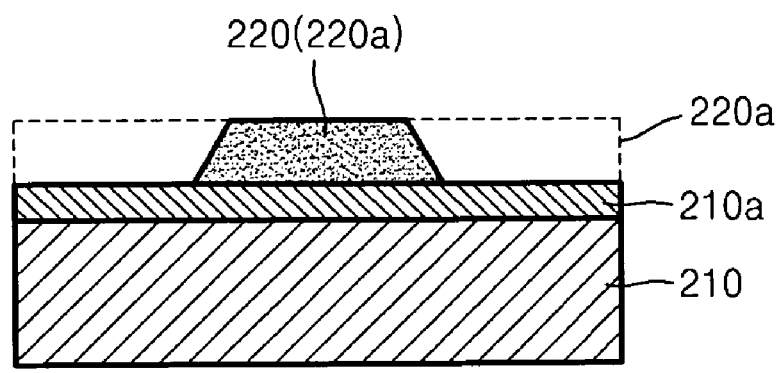
FIGS. 3A through 3E illustrates a method of manufacturing a TFT transistor according to example embodiments.

Referring to FIG. 3A, a substrate 210 may be prepared. A blocking layer 210a may be formed on the substrate 210. A conductive material 220a (e.g., a metal, a conductive metal oxide or the like) may be coated on the blocking layer 210a and patterned to form a gate 220.

Figure 3B:
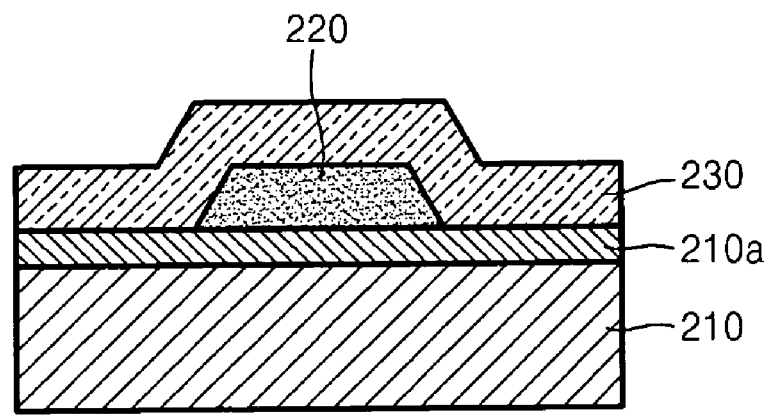

Referring to FIG. 3B, an insulating material (not shown) may be coated on the gate 220 using chemical vapor deposition (CVD) such that the insulating material is patterned to form a gate insulating layer 230.

Figure 3C:
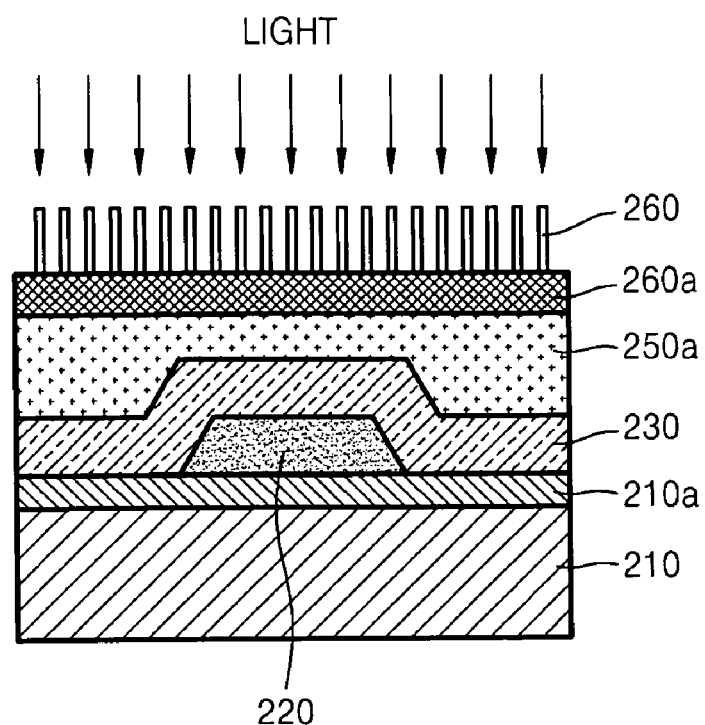

Referring to FIG. 3C, an amorphous Si 250a constituting (or functioning as) a channel material, a heat transfer layer 260a and gold nanorods 260 may be sequentially coated on a portion of the gate insulating layer 230, which corresponds to the gate 220, using the method illustrated in FIGS. 1A through 1C. The amorphous Si 250a may be crystallized.

Figure 3D:
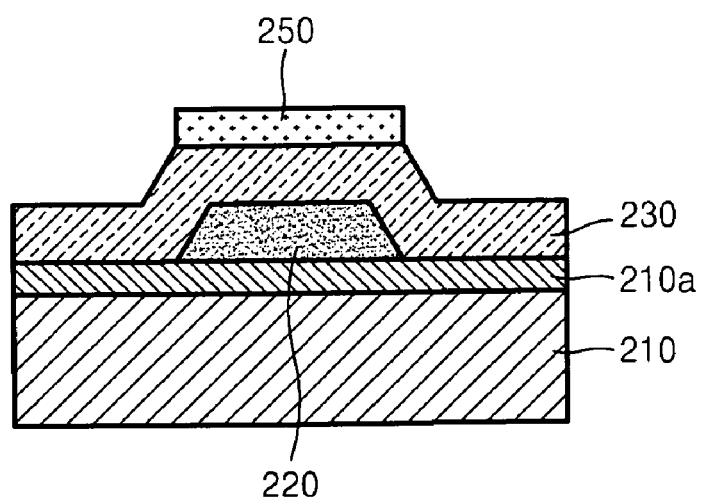

Referring to FIG. 3D, the gold nanorods 260 and the heat transfer layer 260a may be removed. Impurity ions may be injected into the amorphous Si 250a. The amorphous Si 250a may be patterned to form a channel 250.

Figure 3E:
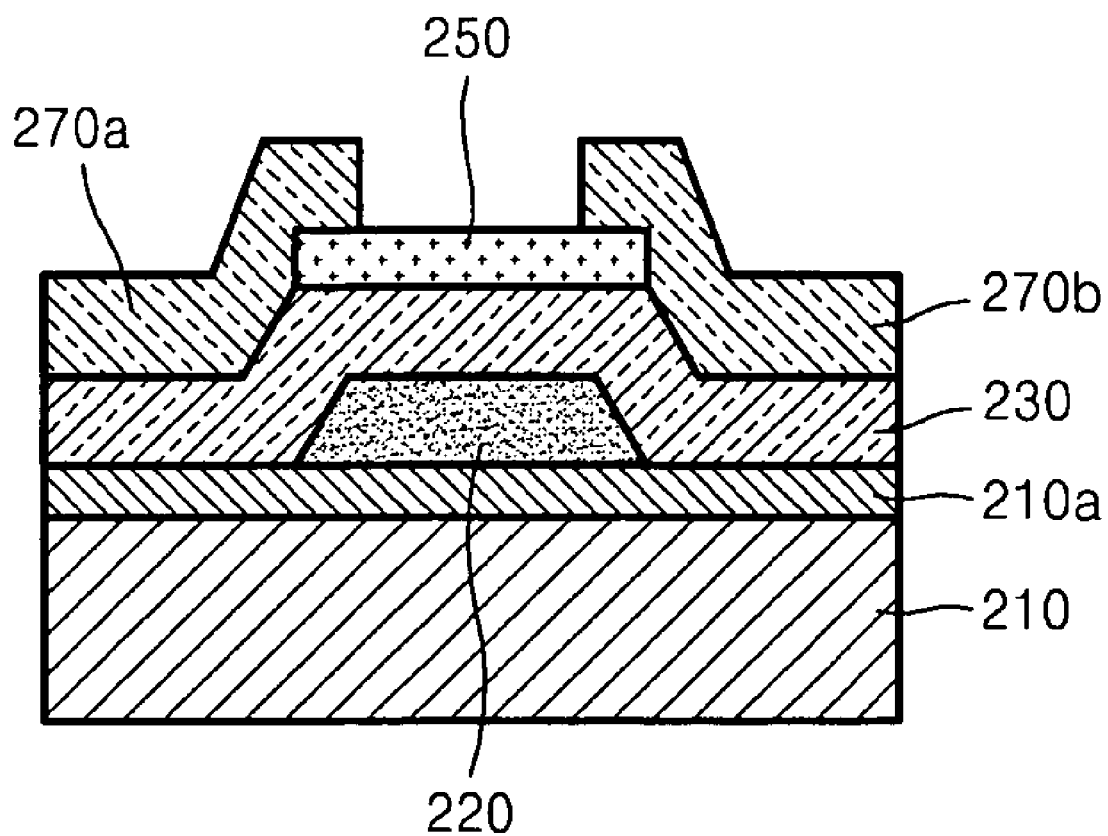

Referring to FIG. 3E, a conductive material (not shown) may be coated on the channel 250 and the gate insulating layer 230. The conductive material may be patterned in a desired pattern to form a source electrode 270a and a drain electrode 270b, which are each connected to (or formed on) opposing side portions of the channel 250.

The source electrode 270a and the drain electrode 270b may be formed of a conductive metal oxide or a metal material. Examples of the conductive metal oxide include an indium tin oxide (ITO), an indium zinc oxide (IZO) and a zinc aluminum oxide (ZAlO), which are known in the art.

Examples of the metal material include titanium (Ti), platinum (Pt), chromium (Cr), tungsten (W), aluminum (Al), nickel (Ni), copper (Cu), molybdenum (Mo), tantalum (Ta) and alloys thereof.

Figure 4:
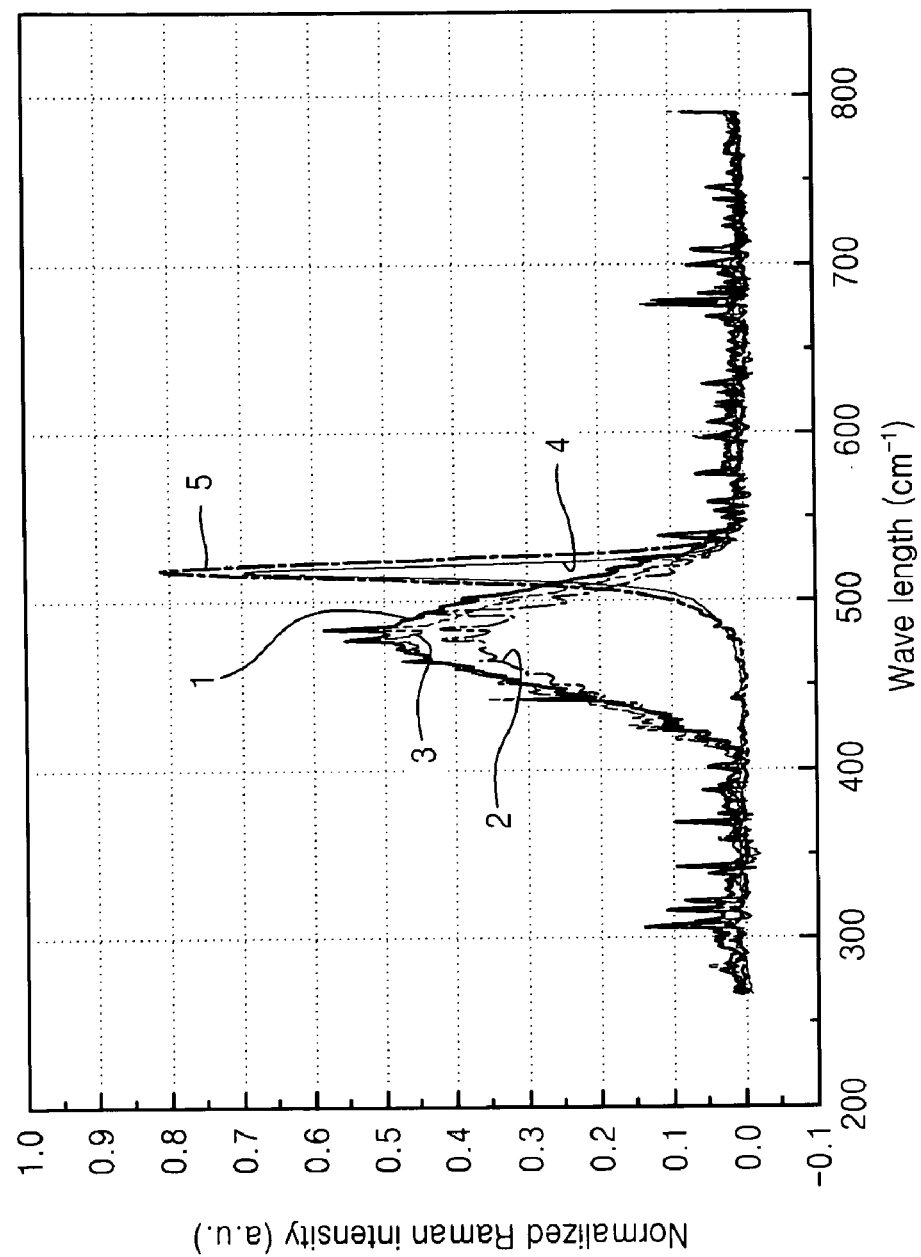

FIG. 4 illustrates raman spectra for checking the degree of crystallinity of silicon (Si) according to example embodiments.

In the raman spectra shown in FIG. 4, poly-crystalline silicon (Si) has a peak of its own in a wavelength of about 510 $cm^{-1}$.

Referring to FIG. 4, reference numbers 1 and 2 denote the raman spectra of a single layer of silicon (Si) and a stack layer silicon and molybdenum (Si/Mo), respectively, in which a light-treatment (or light-absorption) is not performed.

Reference numbers 3, 4 and 5 denote the raman spectra of silicon (Si) having gold nanorods, which are used for crystallizing silicon, formed thereon, wherein light is irradiated onto the silicon (Si). In the case of reference number 3, gold nanorods are coated on the silicon (Si) without a heat transfer layer, and light is subsequently absorbed by the Si. The raman spectrum of the silicon (Si) has no peak of poly-crystalline silicon (Si).

In the case of reference numbers 4 and 5, the raman spectra having peaks of poly-crystalline Si. The reference number 4 denotes the raman spectrum where a heat transfer layer is formed below gold nanorods, and light having an optical power of about 8 W is irradiated onto silicon (Si). The reference number 5 denotes the raman spectrum where a heat transfer layer is not formed below gold nanorods, and light having an optical power of about 12 W is subsequently irradiated onto silicon (Si).

In FIG. 4, crystallization occurs if gold nanorods are coated on the amorphous Si, and light is absorbed by the amorphous Si. Crystallization occurs if the heat transfer layer is not formed below the gold nanorods, and light (having a lower power than the case in which the heat transfer layer is formed) is absorbed by the silicon.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a poly-crystalline silicon (Si) thin film, the method comprising:
   forming an active layer formed of amorphous silicon (Si) on a substrate;
   coating a gold nanorod on the active layer; and
   crystallizing the active layer by irradiating infrared rays onto the gold nanorod.

2. The method of claim 1, wherein a length to diameter ratio of the gold nanorod is in a range of about 0.5 to about 2.

3. The method of claim 1, further comprising forming a heat transfer layer between the active layer and the gold nanorod.

4. The method of claim 3, wherein the heat transfer layer is formed of at least one selected from the group consisting of molybdenum (Mo), chromium (Cr), gold (Au), silver (Ag), AlN and combinations thereof.

5. The method of claim 1, wherein the infrared rays have a wavelength in a range of about 750 nm to about 910 nm.

6. A method of manufacturing a thin film transistor (TFT), the method comprising:
   doping the crystallized active layer according to claim 1 with impurity ions;
   patterning the doped active layer to form a channel region; and
   forming a source electrode and a drain electrode on opposing side portions of the channel region.

7. The method of claim 6, wherein a length to diameter ratio of the gold nanorod is in a range of about 0.5 to about 2.

8. The method of claim 6, further comprising forming a heat transfer layer between the active layer and the gold nanorod.

9. The method of claim 8, wherein the heat transfer layer is formed of at least one selected from the group consisting of molybdenum (Mo), chromium (Cr), gold (Au), silver (Ag), AlN and combinations thereof.

10. The method of claim 6, wherein a wavelength of the infrared rays is in a range of about 750 nm to about 910 nm.

11. A poly-crystalline silicon (Si) thin film, comprising:
    a crystalline active layer on a substrate; and
    a gold nanorod on the crystalline active layer; the crystalline active layer being formed by irradiating infrared rays onto an amorphous silicon (Si) active layer having the gold nanorod thereon.

12. The poly-crystalline silicon (Si) thin film of claim 11, wherein a length to diameter ratio of the gold nanorod is in a range of about 0.5 to about 2.

13. The poly-crystalline silicon (Si) thin film of claim 11, further comprising a heat transfer layer between the active layer and the gold nanorod.

14. The poly-crystalline silicon (Si) thin film of claim 13, wherein the heat transfer layer includes at least one selected from the group consisting of molybdenum (Mo), chromium (Cr), gold (Au), silver (Ag), AlN and combinations thereof.

15. The poly-crystalline silicon (Si) thin film of claim 11, wherein the infrared rays have a wavelength in a range of about 750 nm to about 910 nm.

16. A thin film transistor (TFT), comprising:
    a channel region formed from the poly-crystalline silicon (Si) thin film according to claim 11, wherein the crystalline active layer is doped with impurity ions; and
    a source electrode and a drain electrode each on opposing side portions of the channel region.

17. The thin film transistor (TFT) of claim 16, wherein a length to diameter ratio of the gold nanorod is in a range of about 0.5 to about 2.

18. The thin film transistor (TFT) of claim 16, further comprising a heat transfer layer between the active layer and the gold nanorod.

19. The thin film transistor (TFT) of claim 18, wherein the heat transfer layer includes at least one selected from the group consisting of molybdenum (Mo), chromium (Cr), gold (Au), silver (Ag), AlN and combinations thereof.

20. The thin film transistor (TFT) of claim 16, wherein the infrared rays have a wavelength in a range of about 750 nm to about 910 nm.

* * * * *